US011388276B2

(12) United States Patent
Huh et al.

(10) Patent No.: US 11,388,276 B2
(45) Date of Patent: Jul. 12, 2022

(54) CAMERA MODULE INCLUDING HEAT DISSIPATING STRUCTURE AND ELECTRONIC DEVICE INCLUDING THE SAME

(71) Applicant: Samsung Electronics Co., Ltd., Suwon-si (KR)

(72) Inventors: Jaeyoung Huh, Suwon-si (KR); Kyungwan Park, Suwon-si (KR); Seunghoon Kang, Suwon-si (KR); Boram Kim, Suwon-si (KR); Youngjin Kim, Suwon-si (KR); Sunghoon Moon, Suwon-si (KR); Hongki Moon, Suwon-si (KR); Yoonsun Park, Suwon-si (KR); Hajoong Yun, Suwon-si (KR); Jonghoon Lim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 217 days.

(21) Appl. No.: 16/839,534

(22) Filed: Apr. 3, 2020

(65) Prior Publication Data
US 2020/0322467 A1    Oct. 8, 2020

(30) Foreign Application Priority Data
Apr. 4, 2019    (KR) .......................... 10-2019-0039821

(51) Int. Cl.
*H04M 1/02*    (2006.01)
*H04N 5/225*    (2006.01)
(Continued)

(52) U.S. Cl.
CPC ........ *H04M 1/0264* (2013.01); *H04N 5/2257* (2013.01); *H05K 1/189* (2013.01); *H05K 7/2039* (2013.01)

(58) Field of Classification Search
CPC . H04M 1/0264; H04N 5/2257; H04N 5/2253; H05K 1/189; H05K 7/2039;
(Continued)

(56) References Cited

U.S. PATENT DOCUMENTS

| 7,486,517 B2 * | 2/2009 | Aapro .................. H04M 1/026 165/104.33 |
| 9,456,201 B2 | 9/2016 | Masalkar et al. |

(Continued)

FOREIGN PATENT DOCUMENTS

CN    207382424 U    5/2018

OTHER PUBLICATIONS

European Search Report dated Jul. 27, 2020 in connection with European Patent Application No. 20 16 7786, 11 pages.
(Continued)

*Primary Examiner* — Michael A Matey

(57) ABSTRACT

An electronic device including: a housing including a frame structure that forms a portion of a surface of the electronic device, a plate structure that is surrounded by the frame structure and that includes a first opening, a metal portion containing a metallic material and a polymer portion containing a polymer material; a support plate that faces the plate structure and that includes a polymer area formed of a polymer material; a printed circuit board that makes contact with part of the metal portion of the housing; a camera module disposed between the polymer portion included in the plate structure and the polymer area included in the support plate, the camera module including a camera bracket, a camera PCB, and a light emitting unit and a light receiving unit; and a heat dissipating structure that transfers heat generated from the camera module to the metal portion included in the housing.

20 Claims, 15 Drawing Sheets

(51) Int. Cl.
  *H05K 1/18* (2006.01)
  *H05K 7/20* (2006.01)
(58) Field of Classification Search
  CPC ............. H05K 7/20436; H05K 1/0203; H05K 5/0008; H05K 2201/066; H05K 2201/10121; H05K 2201/10151
  See application file for complete search history.

(56) References Cited

U.S. PATENT DOCUMENTS

| | | | |
|---|---|---|---|
| 9,591,215 B1* | 3/2017 | Miller | .................. H04N 5/2257 |
| D835,597 S | 12/2018 | Lee et al. | |
| 10,225,954 B2 | 3/2019 | Rasmussen et al. | |
| D862,407 S | 10/2019 | Lee et al. | |
| 10,477,082 B2 | 11/2019 | Jung et al. | |
| 10,599,019 B2 | 3/2020 | Kim et al. | |
| 2010/0309369 A1* | 12/2010 | Jarvis | ....................... G03B 9/12 348/371 |
| 2013/0271943 A1* | 10/2013 | Iwai | .......................... G06F 1/16 361/816 |
| 2015/0229912 A1* | 8/2015 | Masalkar | ................. G01S 7/481 348/46 |
| 2015/0326057 A1* | 11/2015 | Koyanagi | ............... H01F 27/36 320/108 |
| 2017/0068292 A1* | 3/2017 | Hooton | .................... G06F 1/203 |
| 2017/0078572 A1 | 3/2017 | Miller et al. | |
| 2017/0289324 A1* | 10/2017 | Yeo | ....................... G06F 1/1637 |
| 2018/0092241 A1 | 3/2018 | Rasmussen et al. | |
| 2018/0139867 A1* | 5/2018 | Muramatsu | ........ H04N 5/22521 |
| 2018/0267390 A1* | 9/2018 | Kim | ....................... G03B 17/55 |
| 2018/0288201 A1* | 10/2018 | Lee | ....................... H04M 1/026 |
| 2019/0045094 A1* | 2/2019 | Fletcher | ............. G06K 9/00214 |
| 2019/0058814 A1* | 2/2019 | Jung | ................... H04N 5/23267 |
| 2019/0306295 A1* | 10/2019 | Cheng | ................. H04M 1/0264 |
| 2020/0092447 A1 | 3/2020 | Fletcher et al. | |
| 2021/0176380 A1* | 6/2021 | Ma | ......................... G03B 30/00 |
| 2021/0227112 A1* | 7/2021 | Guo | ..................... H04N 5/2252 |

OTHER PUBLICATIONS

International Search Report dated Jul. 23, 2020 in connection with International Patent No. PCT/KR2020/004513, 3 pages.

* cited by examiner

CAMERA MODULE INCLUDING HEAT DISSIPATING STRUCTURE AND ELECTRONIC DEVICE INCLUDING THE SAME

CROSS-REFERENCE TO RELATED APPLICATION

This application is based on and claims priority under 35 U.S.C. § 119 to Korean Patent Application No. 10-2019-0039821, filed on Apr. 4, 2019, in the Korean Intellectual Property Office, the disclosure of which is incorporated by reference herein its entirety.

BACKGROUND

1. Field

The disclosure relates to a camera module including a heat dissipating structure and an electronic device including the camera module.

2. Description of Related Art

A TOF camera may be configured to transmit light (e.g., a laser beam or infrared light) to an object, receive the light reflected by the object, and calculate (time of flight) the distance to the object based on a time difference between the transmission of the light and the receipt of the reflected light. The TOF camera may provide distance (or depth) information on a pixel-by-pixel basis. The TOF camera may be used to recognize the object in three dimensions and collect the real-time distance (or depth) information of the object.

A recent mobile electronic device may further include a new type of user identity authentication process such as face recognition. To this end, the mobile electronic device may include a TOF camera.

The above information is presented as background information only to assist with an understanding of the disclosure. No determination has been made, and no assertion is made, as to whether any of the above might be applicable as prior art with regard to the disclosure.

SUMMARY

In the TOF camera included in the mobile electronic device, a light emitting unit and control circuitry may be disposed adjacent to each other due to a limitation of space. The light emitting unit and the control circuitry may consume relatively high power in a small space. The high power consumption of the TOF camera may cause heat generation in the electronic device.

Furthermore, the recent mobile electronic device may include a 5G antenna that operates in a higher frequency band. The 5G antenna may be disposed adjacent to the TOF camera, and therefore the heat generation may be further intensified.

Aspects of the disclosure are to address at least the above-mentioned problems and/or disadvantages and to provide at least the advantages described below. Accordingly, an aspect of the disclosure is to provide a camera module including a heat dissipating structure for reducing the heat generation and an electronic device including the camera module.

In accordance with an aspect of the disclosure, an electronic device includes a housing including a frame structure that forms a portion of a surface of the electronic device and a plate structure that is surrounded by the frame structure and that includes a first opening, the housing including a metal portion containing a metallic material and a polymer portion containing a polymer material, a support plate that faces the plate structure and that includes a polymer area formed of a polymer material, a printed circuit board that is disposed between the plate structure and the support plate and that makes contact with part of the metal portion of the housing, a camera module disposed between the polymer portion included in the plate structure and the polymer area included in the support plate, the camera module including a camera bracket disposed on the polymer area, a camera PCB disposed on the camera bracket, and a light emitting unit and a light receiving unit that are disposed on the camera PCB, and a heat dissipating structure that transfers heat generated from the camera module to the metal portion included in the housing. The heat dissipating structure includes a heat transfer member that is formed between the camera bracket and the polymer area and that extends between the printed circuit board and the support plate.

Other aspects, advantages, and salient features of the disclosure will become apparent to those skilled in the art from the following detailed description, which, taken in conjunction with the annexed drawings, discloses various embodiments of the disclosure.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

The above and other aspects, features, and advantages of certain embodiments of the disclosure will be more apparent from the following description taken in conjunction with the accompanying drawings, in which.

With regard to the description of the drawings, identical or similar reference numerals may be used to refer to identical or similar components.

DETAILED DESCRIPTION

FIGS. 1 through 12D, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

Hereinafter, various embodiments of the disclosure will be described with reference to the accompanying drawings. However, those of ordinary skill in the art will recognize that modification, equivalent, and/or alternative on the various embodiments described herein can be variously made without departing from the scope and spirit of the disclosure.

Figure 1:
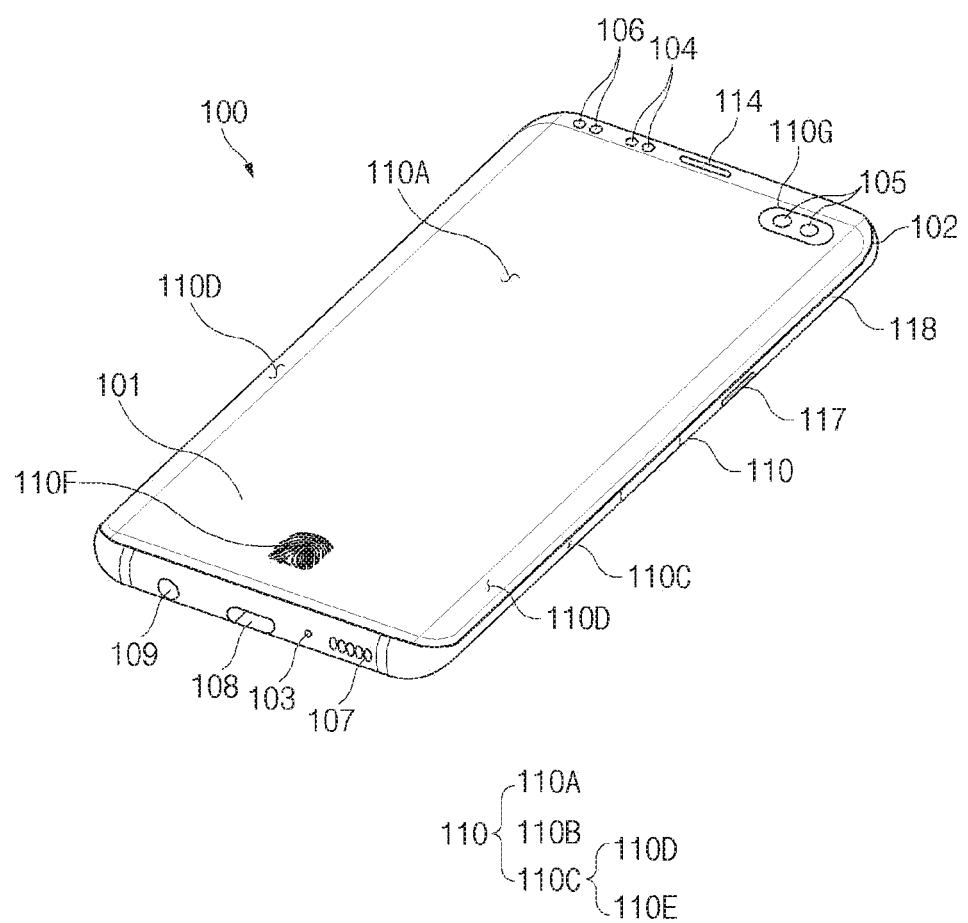
FIG. 1 illustrates a front perspective view of an electronic device according to an embodiment.
Figure 2:
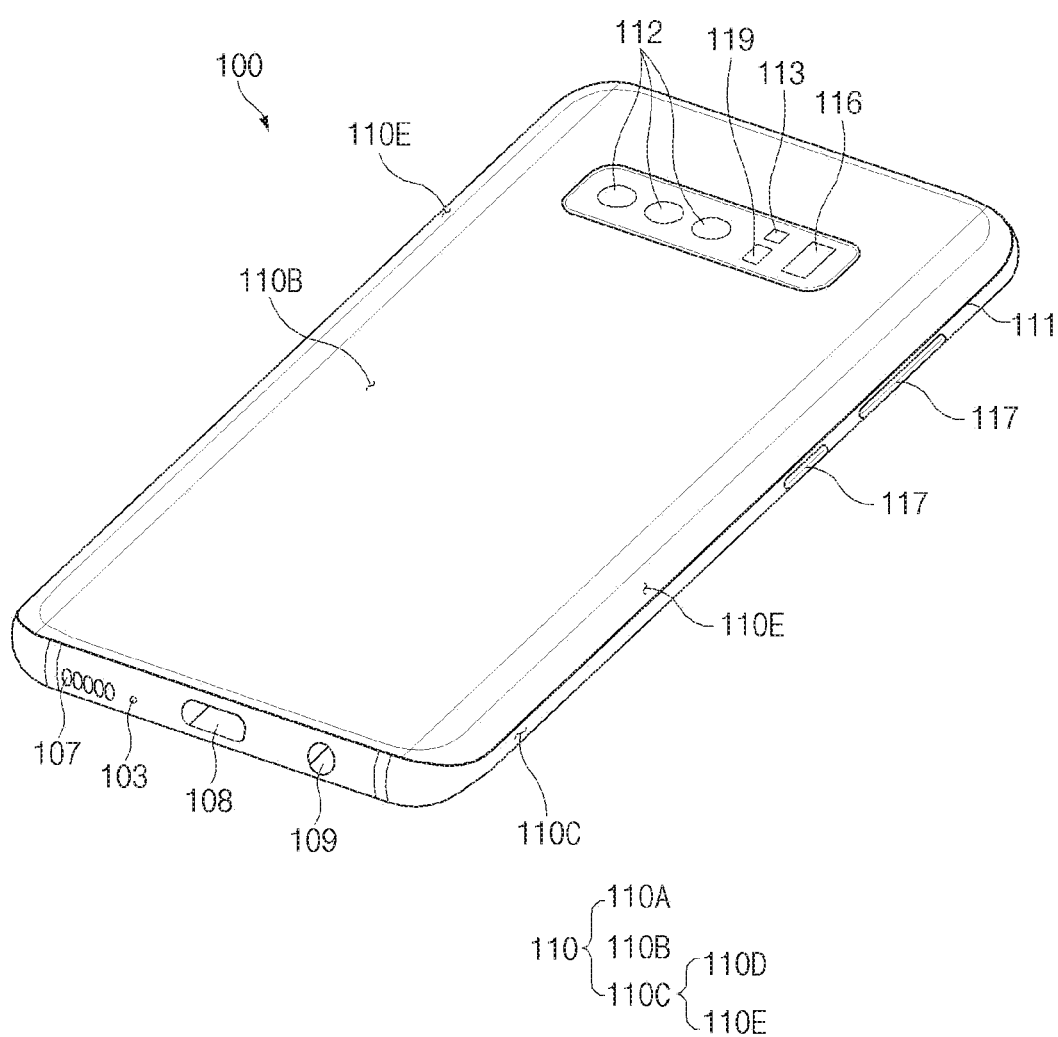
FIG. 2 illustrates a rear perspective view of the electronic device according to an embodiment.

FIG. 1 illustrates a front perspective view of an electronic device according to an embodiment. FIG. 2 illustrates a rear perspective view of the electronic device illustrated in FIG. 1.

Referring to FIGS. 1 and 2, the electronic device 100 may include a housing 110 that includes a first surface (or a front surface) 110A, a second surface (or a rear surface) 110B, and side surfaces 110C that surround a space between the first surface 110A and the second surface 110B.

In another embodiment, the housing 110 may refer to a structure that forms some of the first surface 110A, the second surface 110B, and the side surfaces 110C of FIG. 1.

The first surface 110A may be formed by a front plate 102, at least a portion of which is substantially transparent (e.g., a glass plate or a polymer plate that includes various coating layers). The second surface 110B may be formed by a rear plate 111 that is substantially opaque. The rear plate 111 may be formed of, for example, coated or colored glass, ceramic, a polymer, metal (e.g., aluminum, stainless steel (STS), or magnesium), or a combination of at least two thereof. The side surfaces 110C may be formed by a side bezel structure (or a "side member") 118 that is coupled with the front plate 102 and the rear plate 111 and that contains metal and/or a polymer.

In some embodiments, the rear plate 111 and the side bezel structure 118 may be integrally formed with each other and may contain the same material (e.g., a metallic material such as aluminum).

As shown in FIGS. 1 and 2, the front plate 102 may include, at opposite long edges thereof, two first areas 110D that curvedly and seamlessly extend toward the rear plate 111 from the first surface 110A.

As shown in FIG. 2, the rear plate 111 may include, at opposite long edges thereof, two second areas 110E that curvedly and seamlessly extend toward the front plate 102 from the second surface 110B.

In some embodiments, the front plate 102 (or the rear plate 111) may include one of the first areas 110D (or the second areas 110E). In another embodiment, the front plate 102 (or the rear plate 111) may not include a part of the first areas 110D (or the second areas 110E).

When viewed from a side of the electronic device 100, the side bezel structure 118 may have a first thickness (or width) at sides (e.g., short sides) not including the first areas 110D or the second areas 110E and may have a second thickness smaller than the first thickness at sides (e.g., long sides) including the first areas 110D or the second areas 110E.

The electronic device 100 may include at least one of a display 101, audio modules 103, 107, and 114, sensor modules 104, 116, and 119, camera modules 105, 112, and 113, key input devices 117, light emitting elements 106, and connector holes 108 and 109. In some embodiments, the electronic device 100 may omit at least one component (e.g., the key input devices 117 or the light emitting elements 106) among the components, or may additionally include other component(s).

The display 101 may be exposed through, for example, a large portion of the front plate 102. In some embodiments, at least a portion of the display 101 may be exposed through the front plate 102 that includes the first surface 110A and the first areas 110D of the side surfaces 110C.

The edge of the display 101 may be formed to be substantially the same as the shape of the adjacent periphery of the front plate 102. In another embodiment, the gap between the periphery of the display 101 and the periphery of the front plate 102 may be substantially constant to expand the area by which the display 101 is exposed.

A surface of the housing 110 (or the front plate 102) may include a screen display area that is formed as the display 101 is visually exposed. For example, the screen display area may include the first surface 110A and the first areas 110D of the side surfaces 110C.

As shown in FIGS. 1 and 2, the screen display area 110A and 110D may include a sensing area 110F configured to obtain biometric information of a user. Here, when the screen display area 110A and 110D includes the sensing area 110F, at least a portion of the sensing area 110F overlaps the screen display area 110A and 110D. In other words, the sensing area 110F may refer to an area for displaying visual information by the display 101 similarly to the other area of the screen display area 110A and 110D and additionally obtaining the user's biometric information (e.g., fingerprint).

The screen display area 110A and 110D of the display 101 may include an area 110G through which the first camera device 105 (e.g., a punch hole camera) is visually exposed. At least a portion of the edge of the area 110G, through which the first camera device 105 is exposed, may be surrounded by the screen display area 110A and 110D. In various embodiments, the first camera device 105 may include a plurality of camera devices.

In another embodiment, recesses or openings may be formed in portions of the screen display area 110A and 110D of the display 101, and the electronic device 100 may include at least one of the audio module 114, the first sensor module 104, and the light emitting elements 106 that are aligned with the recesses or the openings.

In another embodiment, the display 101 may include, on a rear surface of the screen display area 110A and 110D, at least one of the audio module 114, the sensor modules 104, 116, and 119, and the light emitting elements 106.

In another embodiment, the display 101 may be coupled with, or disposed adjacent to, touch detection circuitry, a pressure sensor for measuring the intensity (pressure) of a touch, and/or a digitizer for detecting a stylus pen of a magnetic type.

At least a part of the sensor modules 104, 116, and 119 and/or at least a part of the key input devices 117 may be disposed on the side surfaces 110C (e.g., the first areas 110D and/or the second areas 110E).

The audio modules 103, 107, and 114 may include the microphone hole 103 and the speaker holes 107 and 114. A microphone for obtaining a sound from the outside may be disposed in the microphone hole 103, and in some embodiments, a plurality of microphones may be disposed in the microphone hole 103 to sense the direction of a sound. The speaker holes 107 and 114 may include the external speaker hole 107 and the receiver hole 114 for a telephone call. The speaker holes 107 and 114 and the microphone hole 103 may be implemented with one hole, and a speaker (e.g., a piezoelectric speaker) may be included without the speaker holes 107 and 114.

The sensor modules 104, 116, and 119 may generate an electrical signal or a data value that corresponds to an operational state inside the electronic device 100 or an environmental state outside the electronic device 100. For example, the sensor modules 104, 116, and 119 may include the first sensor module 104 (e.g., a proximity sensor) that is disposed on the first surface 110A of the housing 110, the second sensor module 116 (e.g., a TOF camera device) that is disposed on the second surface 110B of the housing 110, the third sensor module 119 (e.g., a heart rate monitor (HRM) sensor) that is disposed on the second surface 110B of the housing 110, and/or the fourth sensor module (e.g., a sensor 190 of FIG. 3) (e.g., a fingerprint sensor) that is coupled to the display 101.

The TOF camera is configured to emit light (e.g., laser, infrared) to the object, receive the light reflected by the object, and calculate the distance to the object based on the time difference from transmission to reception. The TOF camera may provide distance (or depth) information in pixel units of the camera. The TOF camera may be utilized to recognize an object in three dimensions and collect real-time distance (or depth) information of the object.

The second sensor module 116 may include a TOF camera device for measuring distance.

At least a portion of the fourth sensor module (e.g., the sensor 190 of FIG. 3) may be disposed under the screen display area 110A and 110D. For example, the fourth sensor module may be disposed in a recess 139 that is formed on a rear surface of the display 101. That is, the fourth sensor module may not be exposed on the screen display area 110A and 110D and may form the sensing area 110F on at least part of the screen display area 110A and 110D.

The fingerprint sensor may be disposed not only on the first surface 110A of the housing 110 (e.g., the screen display area 110A and 110D) but also on the second surface 110B.

The electronic device 100 may further include a non-illustrated sensor module, which may be, for example, at least one of a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, or an illuminance sensor.

The camera modules 105, 112, and 113 may include the first camera device 105 (e.g., a punch hole camera device) that is exposed through the first surface 110A of the electronic device 100, and the second camera device 112 and/or the flash 113 exposed through the second surface 110B.

As shown in FIG. 1, the first camera device 105 may be exposed through a portion of the screen display area 110D of the first surface 110A. For example, the first camera device 105 may be exposed on a partial area of the screen display area 110D through an opening formed in a portion of the display 101.

The second camera device 112 may include a plurality of camera devices (e.g., a dual camera and a triple camera). However, the second camera device 112 is not necessarily limited to including the plurality of camera devices. The second camera device 112 may include one camera device.

The camera devices 105 and 112 may include one or more lenses, an image sensor, and/or an image signal processor (ISP). The flash 113 may include, for example, a light emitting diode or a xenon lamp. In some embodiments, two or more lenses (an IR camera lens, a wide angle lens, and a telephoto lens) and image sensors may be disposed on one surface of the electronic device 100.

The key input devices 117 may be disposed on the side surfaces 110C of the housing 110. The electronic device 100 may not include all or some of the aforementioned key input devices 117, and the key input devices 117 not included may be implemented in different forms such as soft keys on the display 101. In some embodiments, the key input devices may include a sensor module (e.g., the sensor 190 of FIG. 3) that forms the sensing area 110F included in the screen display area 110A and 110D.

The light emitting elements 106 may be disposed on, for example, the first surface 110A of the housing 110. The light emitting elements 106 may provide, for example, state information of the electronic device 100 in the form of light. The light emitting elements 106 may provide, for example, a light source that operates in conjunction with the first camera device 105. The light emitting elements 106 may include, for example, an LED, an IR LED, and a xenon lamp.

The connector holes 108 and 109 may include the first connector hole 108 in which a connector (e.g., a USB connector) for transmitting and receiving power and/or data with an external electronic device is received, and/or the second connector hole 109 (e.g., an earphone jack) in which a connector for transmitting and receiving audio signals with an external electronic device is received.

Figure 3:
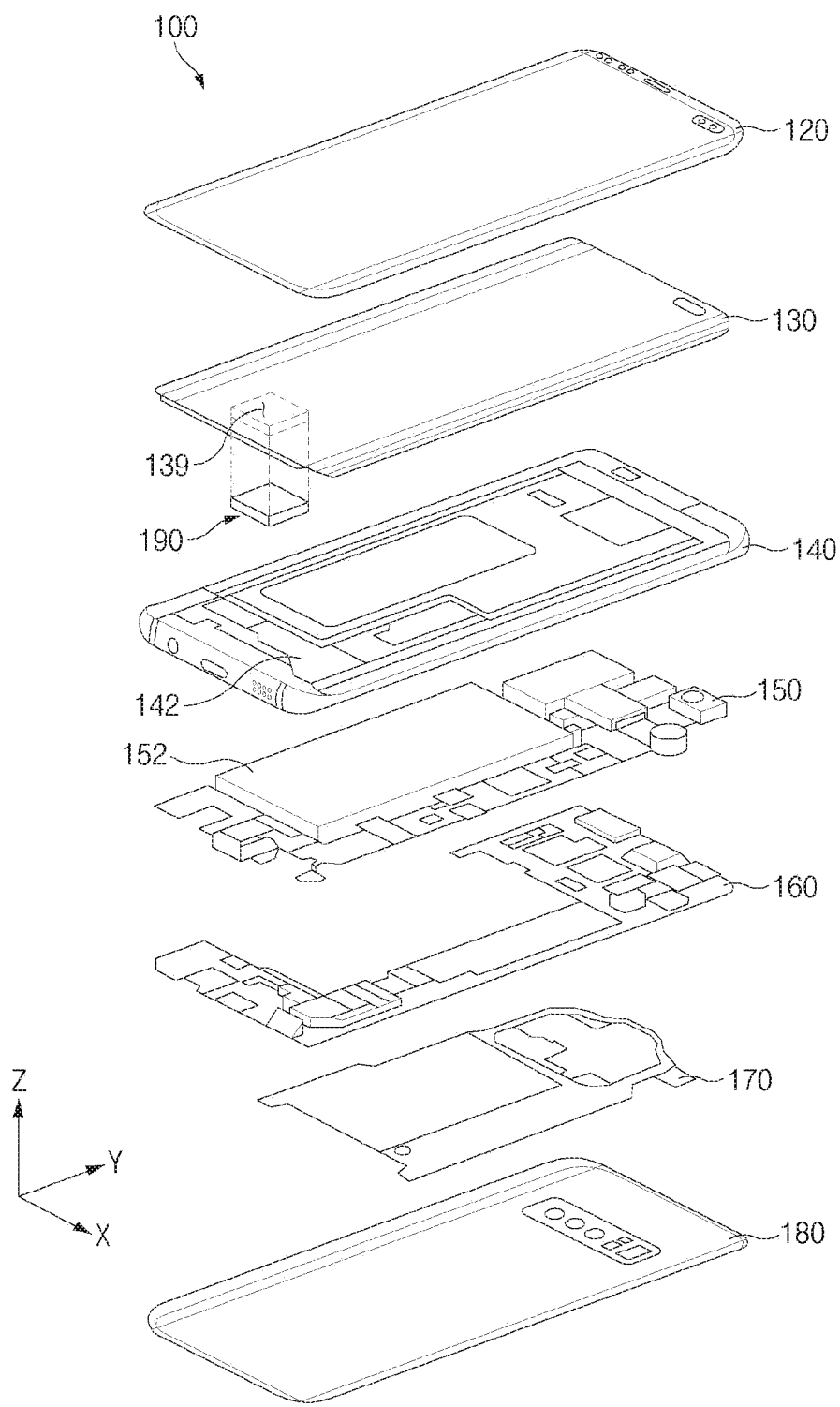
FIG. 3 illustrates an exploded perspective view of the electronic device according to an embodiment.

FIG. 3 illustrates an exploded perspective view of the electronic device illustrated in FIG. 1.

Referring to FIG. 3, the electronic device 100 may include a side member 140, a first support member 142 (e.g., a bracket), a front plate 120, a display 130 (e.g., the display 101 of FIG. 1), a printed circuit board (PCB) 150, a battery 152, a second support member 160 (e.g., a rear case), an antenna 170, and a second cover 180. In some embodiments, the electronic device 100 may omit at least one component (e.g., the first support member 142 or the second support member 160) among the aforementioned components, or may additionally include other component(s). At least one of the components of the electronic device 100 may be the same as, or similar to, at least one of the components of the electronic device 100 of FIG. 1 or FIG. 2, and repetitive descriptions will be omitted.

The first support member 142 may be disposed in the electronic device 100 and may be connected with the side member 140, or may be integrally formed with the side member 140. The first support member 142 may be formed of, for example, a metallic material and/or a nonmetallic (e.g., polymer) material. The first support member 142 may have one surface to which the display 130 is coupled and an opposite surface to which the PCB 150 is coupled. The PCB 150 may have a processor, a memory, and/or an interface mounted thereon. The processor may include one or more of, for example, a central processing unit (CPU), an application processor (AP), a graphic processing unit (GPU), an ISP, a sensor hub processor, or a communication processor (CP).

The memory may include, for example, a volatile memory or a nonvolatile memory.

The interface may include, for example, a high definition multimedia interface (HDMI), a universal serial bus (USB) interface, an SD card interface, and/or an audio interface. The interface, for example, may electrically or physically connect the electronic device 100 with an external electronic device and may include a USB connector, an SD card/MMC connector, or an audio connector.

The battery 152 may be a device for supplying power to at least one component of the electronic device 100 and may include, for example, a primary cell that is not rechargeable, a secondary cell that is rechargeable, or a fuel cell. For example, at least a portion of the battery 152 may be disposed on substantially the same plane as the PCB 150. The battery 152 may be integrally disposed in the electronic device 100 and may be disposed so as to be detachable from the electronic device 100.

The antenna 170 may be disposed between the second cover 180 and the battery 152. The antenna 170 may include, for example, a near field communication (NFC) antenna, a wireless charging antenna, and/or a magnetic secure transmission (MST) antenna. For example, the antenna 170 may perform short range communication with an external device, or may wirelessly transmit and receive power used for charging. In another embodiment, an antenna structure may be formed by the side member 140 and/or a portion of the first support member 142, or a combination thereof.

Referring to FIG. 3, the electronic device 100 may further include the sensor 190 coupled to the display 130. The sensor 190 may be disposed in the recess 139 (e.g., an opening 225 of FIG. 4) that is formed on a rear surface of the display 130. The sensor 190 may form a sensing area 110F on a portion of the front plate 120.

Figure 4:
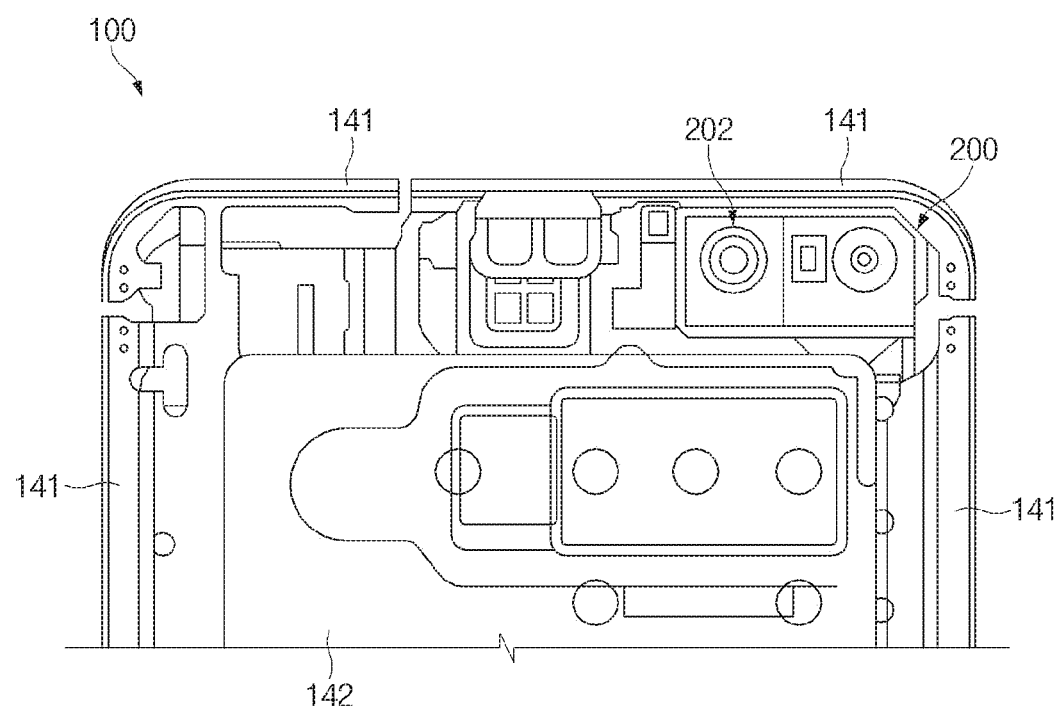
FIG. 4 is a view illustrating a housing of the electronic device and a camera module disposed in the housing according to an embodiment.

FIG. 4 is a view illustrating the housing 140 of the electronic device 100 and a camera module 200 disposed in the housing 140 according to an embodiment.

In an embodiment, the electronic device 100 may include the housing 140 and the camera module 200 disposed in the housing 140. The housing 140 may include a plate structure 142 on which mechanical parts (e.g., a printed circuit board and a display) are disposed and a frame structure 141 surrounding the periphery of the plate structure 142.

In the illustrated embodiment, the camera module 200 may be disposed on the plate structure 142. The camera module 200 may be disposed adjacent to the frame structure 141. The camera module 200 may be disposed adjacent to a second camera module 202. For example, the second camera module 202 may include an RGB camera device. In some embodiments, the camera module 200 and the second camera module 202 may be combined to form one integrated module.

Figure 5:
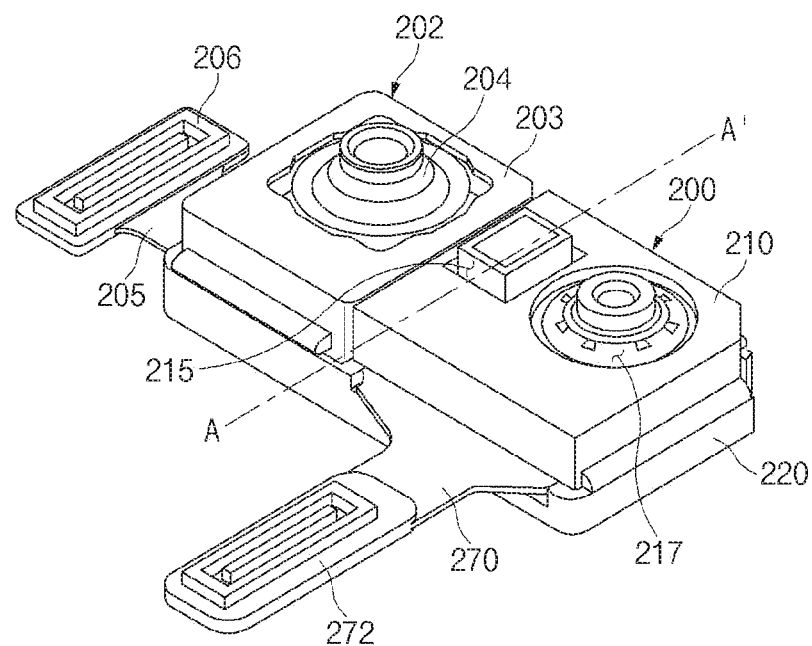
FIG. 5 is a perspective view illustrating the camera module of the electronic device and the interior of the camera module according to an embodiment.
Figure 5:
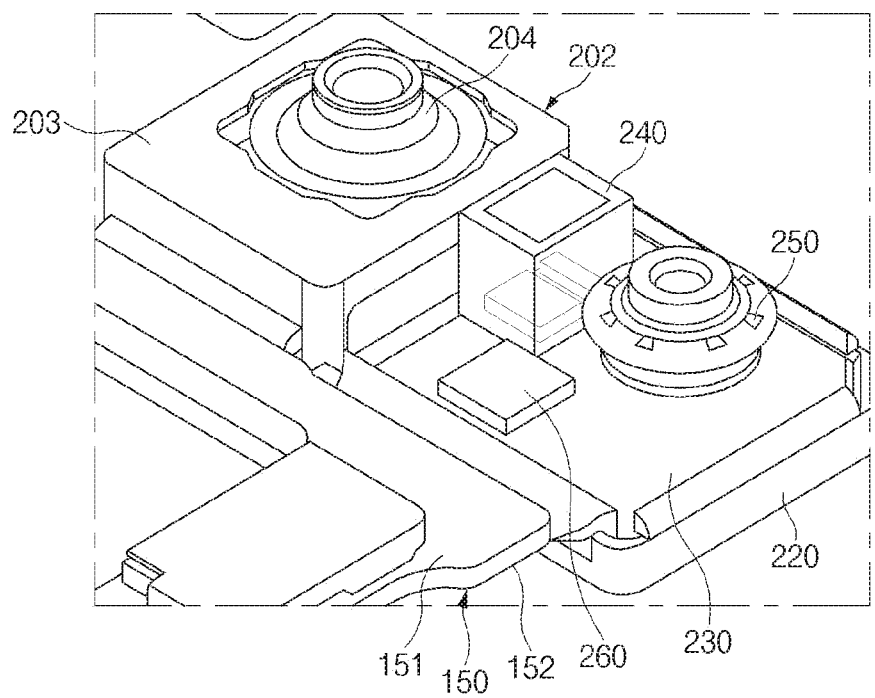

FIG. 5 is a perspective view illustrating the camera module 200 of the electronic device 100 and the interior of the camera module 200 according to an embodiment.

In the illustrated embodiment, the camera module 200 may include a camera bracket 220, a camera housing 210, a camera PCB 230, a light receiving unit 250, a light emitting unit 240, control circuitry 260, and a connecting member 270.

In various embodiments, the camera bracket 220 may be disposed in a recess or opening formed on the plate structure 142. The camera bracket 220 may be formed to support the camera PCB 230. The camera bracket 220 may be coupled with the camera housing 210 to form a space in which the light emitting unit 240, the light receiving unit 250, the control circuitry 260, and the camera PCB 230 are disposed. A portion of the camera bracket 220 may be included in the second camera module 202. That is, a second camera device 204, a second camera housing 203, or a second camera PCB may be disposed on the camera bracket 220.

In various embodiments, the second camera module 202 may include a second connecting member 205 extending from the interior of the second camera housing 203 and a second connector 206 formed on the second connecting member 205. The second connector 206 may be coupled to a corresponding connector formed on the printed circuit board 150.

In various embodiments, the camera housing 210 may include a first opening 215 through which the light emitting unit 240 is exposed and a second opening 217 through which the light receiving unit 250 is exposed. At least a portion of the light emitting unit 240 may be disposed in the first opening 215. At least a portion of the light receiving unit 250 may be disposed in the second opening 217. The camera housing 210 may be coupled with the camera bracket 220 to form an interior space. The camera PCB 230, the light emitting unit 240, the light receiving unit 250, and the control circuitry 260 may be disposed in the interior space. The second camera housing 203 included in the second camera module 202 may be disposed adjacent to one side of the camera housing 210. That is, the camera housing 210 and the second camera housing 203 may be coupled to the one camera bracket 220.

In various embodiments, the camera PCB 230 may be disposed on the camera bracket 220. The camera PCB 230 may include the light receiving unit 250, the light emitting unit 240, and the control circuitry 260 that controls the light emitting unit 240. The light emitting unit 240 may be configured to transmit light to the outside (e.g., the front surface) of the electronic device 100 through the first opening 215 formed in the camera housing 210. The light receiving unit 250 may be configured to receive light incident on the electronic device 100 through the second opening 217 formed in the camera housing 210. The first opening 215 and the second opening 217 may be integrated with each other. The control circuitry 260 may be configured to control the light emitting unit 240. For example, the light emitting unit 240 may be configured to transmit light with a pulse having a certain period, and the control circuitry 260 may be configured to control the pulse (e.g., the period of the pulse).

In various embodiments, the camera module 200 may include the connecting member 270 extending from the camera PCB 230 to the printed circuit board 150. The connecting member 270 may electrically connect an electric element (e.g., the control circuitry 260 or the light receiving unit 250) of the camera PCB 230 and an electric element (e.g., a processor) of the printed circuit board 150. In some embodiments, the connecting member 270 may be integrally formed with the camera PCB 230. In some embodiments, the connecting member 270 may include an FPCB extending from the camera PCB 230.

In various embodiments, the camera housing 210 may contain a metallic material and/or a polymer material. The camera housing 210 may be formed by injection molding of a polymer material on a metal portion formed of a metallic material. The camera bracket 220 may contain a polymer material.

In embodiments of the disclosure, the camera housing 210 and/or the camera bracket 220 may be formed of various materials capable of ensuring a predetermined strength.

Figure 6:
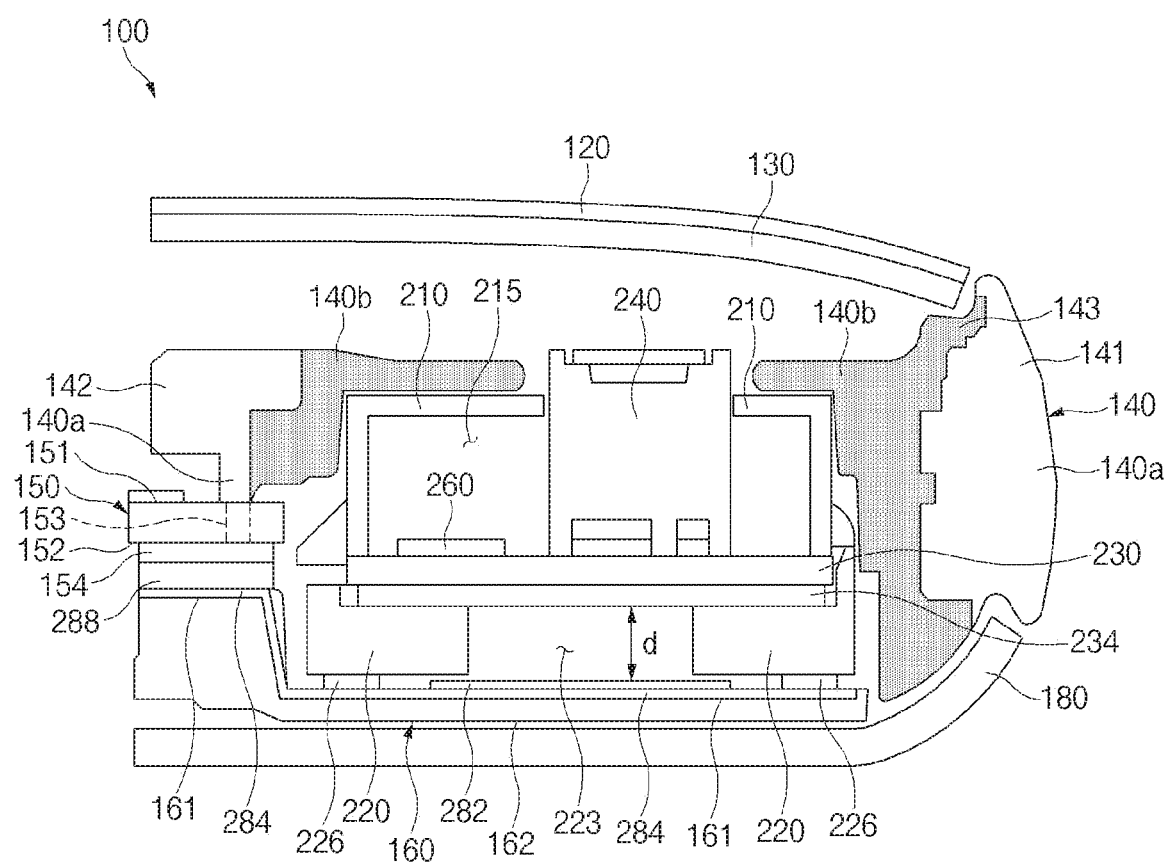
FIG. 6 illustrates a sectional view of the electronic device according to an embodiment.

FIG. 6 illustrates a sectional view of the electronic device 100 according to an embodiment. FIG. 6 is a sectional view taken along line A-A' of FIG. 5.

In the illustrated embodiment, the electronic device 100 may include the first cover 120, the second cover 180, the housing 140, the display 130, the printed circuit board 150, and the support plate 160.

In the illustrated embodiment, the first cover 120 may form a first surface (e.g., the front surface) of the electronic device 100. The first cover 120 may include a flat portion and a curved portion formed around the flat portion. The flat portion of the first cover 120 may face a first direction (e.g., an upper direction with respect to the drawing). The first cover 120 may be disposed on the housing 140 such that a peripheral portion is seated on a seating area 143 formed on the frame structure 141 of the housing 140. The first cover 120, together with the second cover 180 and the housing 140, may form a space in which the printed circuit board 150 and the camera module 200 are disposed. The first cover 120 may be formed to be transparent such that a screen display area is formed by light emitting elements (e.g., OLED elements) included in the display 130. In some embodiments, the first cover 120 may be formed of at least one layer among a plurality of layers included in the display 130. The first cover 120 may include a layer (e.g., a cover layer) that forms the surface among the plurality of layers included in the display 130.

In the illustrated embodiment, the second cover 180 may form a second surface (e.g., the rear surface) of the electronic device 100. The second cover 180 may include a flat portion and a curved portion formed around the flat portion. The flat portion of the second cover 180 may face a second direction (e.g., a lower direction with respect to the drawing) that is opposite to the first direction. The second cover 180 may be disposed on the housing 140 such that a peripheral portion is seated on the seating area 143 formed on the frame structure 141 of the housing 140. The second cover 180, together with the first cover 120 and the housing 140, may form the space in which the printed circuit board 150 and the camera module 200 are disposed.

In the illustrated embodiment, the display 130 may be disposed between the first cover 120 and the second cover 180 so as to be visually exposed on the surface of the electronic device 100 through the first cover 120. At this time, a portion of the periphery of the display 130 may be disposed on the seating area 143 of the frame structure 141. In some embodiments, the display 130 may include a plurality of layers, and the first cover 120 may be formed of a layer formed on the surface among the plurality of layers. In some embodiments, the electronic device 100 may include a display module that includes the display 130 and the first cover 120 that is formed on one surface of the display 130 and that forms a surface (e.g., the front surface) of the electronic device 100.

In the illustrated embodiment, the housing 140 may include the frame structure 141 on which the first cover 120 and the second cover 180 are seated and the plate structure 142 extending from the frame structure 141 into the space between the first cover 120 and the second cover 180. The frame structure 141 may form a surface (e.g., a side surface) of the electronic device 100 together with the first cover 120 (e.g., the front surface) and the second cover 180 (e.g., the rear surface).

In the illustrated embodiment, the frame structure 141 may include the seating area 143 extending toward the interior of the housing 140. At least one of the first cover 120, the second cover 180, and the display 130 may be disposed on the seating area 143. The housing 140 may be coupled with the first cover 120 and the second cover 180 to form a space inside. The printed circuit board 150, the support plate 160, and the display 130 may be disposed in the space. In some embodiments, the housing 140 may refer to a housing structure that includes the frame structure 141, the first cover 120, and the second cover 180.

In the illustrated embodiment, the plate structure 142 may have an opening formed therein in which a camera module (e.g., the camera PCB 230 and the camera bracket 220) is disposed. A portion of an inner wall of the opening may be formed by the plate structure 142. The plate structure 142 that forms the inner wall of the opening may be formed to be a polymer portion 140b. The display 130 may be disposed between the plate structure 142 and the first cover 120. The printed circuit board 150 may be disposed on a second surface of the plate structure 142. The printed circuit board 150 may be disposed between the plate structure 142 and the second cover 180.

In the illustrated embodiment, the housing 140 may include a metal portion 140a containing a metallic material and the polymer portion 140b containing a polymer material. The polymer portion 140b may include a portion of an inner surface of the frame structure 141. The polymer portion 140b may include a portion of the inner wall of the opening and a peripheral portion of the opening. The polymer portion 140b may surround at least part of a peripheral portion of the camera module 200 disposed in the opening. The polymer portion 140b may form the seating area 143 extending toward the interior space of the housing 140 from the inner surface of the frame structure 141.

In the illustrated embodiment, the printed circuit board 150 may include a first surface facing toward the first cover 120 and a second surface 152 facing toward the second cover 180. The metal portion 140a of the plate part of the housing 140 may extend to the first surface 151 of the printed circuit board 150. A first contact area that makes contact with the metal portion 140a may be formed on at least a portion of the first surface 151 of the printed circuit board 150. A second metal layer 154 may be formed on the second surface 152 of the printed circuit board 150. The second metal layer 154 may include a metal area mounted on the printed circuit board 150. A portion of a heat transfer member (e.g., a metal pattern sheet 284, a heat conductive tape 288, or the second metal layer 154) that extends from the camera module 200 may be disposed on the second surface 152 of the printed circuit board 150. A second contact area where the second metal layer 154 is formed may be formed on the second surface 152 of the printed circuit board 150.

In various embodiments, the printed circuit board 150 may include a plurality of vias 153 passing through the first contact area and the second contact area. The plurality of vias 153 may pass through the printed circuit board 150 to connect the metal portion 140a of the housing 140 and the heat conductive tape 288 brought into contact with the second contact area. Accordingly, the metal pattern sheet 284, the heat conductive tape 288, the plurality of vias 153, and the metal portion 140a of the housing 140 may form a heat transfer path. In various embodiments, the area of the printed circuit board 150 with which the metal portion 140a of the housing 140 makes contact and the area of the printed circuit board 150 with which the heat transfer member (e.g., the metal pattern sheet 284, the heat conductive tape 288, or the second metal layer 154) makes contact may each include an area where an inner conductive layer is exposed by removing an insulation layer of the printed circuit board 150. For example, the areas may contain a metallic material mounted on a portion of the conductive layer exposed by removing the insulation layer of the printed circuit board 150.

In the illustrated embodiment, the support plate 160 may be disposed between the second cover 180 and the plate structure 142. The support plate 160 may extend to cover at least a part of the printed circuit board 150 and the camera module 200. The support plate 160 may include a first surface 161 facing toward the printed circuit board 150 and a second surface 162 facing toward the second cover 180. The camera module 200 and the heat transfer member extending from the camera module 200 to the printed circuit board 150 may be disposed on the first surface 161 of the support plate 160. The second surface 162 of the support plate 160 may face the second cover 180. In various embodiments, the support plate 160 may be formed of a polymer material. In various embodiments, the support plate 160 may include a polymer area formed of a polymer material. For example, the camera module 200 may be disposed on the polymer area. That is, the support plate 160, together with the polymer portions 140b of the frame structure 141 and the plate structure 142, may form at least a portion (e.g., a lower surface with respect to the drawing) of a space in which the camera module 200 is disposed.

In the illustrated embodiment, the camera module 200 may include the camera PCB 230, the camera bracket 220, the light emitting unit 240, a light receiving unit (e.g., the light receiving unit 250 of FIG. 5), and the control circuitry 260. The camera bracket 220 may support the camera PCB 230 such that the camera PCB 230 is spaced apart from the first surface 161 of the support plate 160 at a certain interval d. In some embodiments, the camera bracket 220 may be disposed on the first surface 161 of the support plate 160. The support plate 160 may include an opening 223 formed such that a portion of the camera PCB 230 faces the first surface 161 of the support plate 160. The camera bracket 220 may be formed such that the heat transfer member and a first metal layer 234 of the camera PCB 230 face each other to allow heat generated from the camera PCB 230 to be transferred to the heat transfer member (e.g., a heat dissipating sheet 282) through the opening 223. The camera bracket 220 may be supported on the support plate 160 or the metal pattern sheet 284 by a cushion member 226.

In various embodiments, the electronic device 100 may include a heat transfer structure formed such that heat generated from the camera PCB 230 is transferred to the metal portion 140a of the housing 140.

In various embodiments, the heat transfer structure may include the heat dissipating sheet 282, the metal pattern sheet 284, the metal layers 154 and 234, and the heat conductive tape 288.

The heat dissipating sheet 282 may be formed on the first surface 161 of the support plate 160 and may be formed to at least partially face the camera PCB 230. The heat dissipating sheet 282 may be spaced apart from the first metal layer 234 of the camera PCB 230 at a certain interval d. The heat dissipating sheet 282 may cover the opening 223 formed in the camera bracket 220. The heat dissipating sheet 282 may include a graphite sheet that more efficiently releases heat in the width direction than in the height direction. The graphite sheet may have a heat transfer rate of 1500 w/mK in the horizontal direction.

The metal pattern sheet 284 may be disposed between the heat dissipating sheet 282 and the first surface 161 of the support plate 160. The metal pattern sheet 284 may extend from between the camera PCB 230 and the first surface 161 of the support plate 160 to between the second surface 152 of the printed circuit board 150 and the first surface 161 of the support plate 160. The support plate 160 may be formed such that the first surface 161 has a height difference (e.g., the thickness from the second surface 162 to the first surface 161). The metal pattern sheet 284 may be formed to be flexible. For example, the metal pattern sheet 284 may include a metal pattern formed on a flexible insulation sheet. In some embodiments, the metal pattern sheet 284 may include a ground area of one or more electric elements (e.g., an antenna) that are contained in the housing 140.

In various embodiments, the heat conductive tape 288 may contain a heat conductive material and an adhesive material. The heat conductive tape 288 may be disposed between the second surface 152 of the printed circuit board 150 and the metal pattern sheet 284. The heat conductive tape 288 may have a double-sided adhesive layer such that one side is attached to the metal pattern sheet 284 and the other side is attached to the second metal layer 154 formed on the second surface 152 of the printed circuit board 150.

In various embodiments, the heat transfer structure may include the first metal layer 234 disposed on the camera PCB 230 and the second metal layer 154 disposed on the printed circuit board 150. The first metal layer 234 may be supported by the camera bracket 220 to reinforce the strength of the camera PCB 230. The first metal layer 234 may face the heat dissipating sheet 282 though the space in the camera bracket 220. The second metal layer 154 may be formed on the second surface 152 of the printed circuit board 150 to reinforce the strength of the printed circuit board 150 and transfer heat from the heat conductive tape 288 to the contact area of the printed circuit board 150. In some embodiments, the first metal layer 234 and the second metal layer 154 may each contain clad metal. The clad metal may include stainless steel and copper, or the clad metal may include stainless steel and aluminum. The clad metal may have a heat transfer rate of 200 w/mK. In some embodiments, the first metal layer 234 and the second metal layer 154 may each contain a copper alloy.

In the illustrated embodiment, heat generated from the camera PCB 230 may be transferred from the first metal layer 234 to the heat dissipating sheet 282 through the opening 223. The heat transferred to the heat dissipating sheet 282 may be rapidly diffused in the horizontal direction. The heat diffused across the heat dissipating sheet 282 may be transferred to the heat conductive tape 288 through the metal pattern sheet 284. The heat conductive tape 288 may be configured to transfer the heat from the metal pattern sheet 284 to the plurality of vias 153 of the printed circuit board 150 through the second metal layer 154. The heat transferred to the vias 153 may be transferred to the metal portion 140a of the housing 140.

In various embodiments, the heat transfer structure may form a heat transfer path that passes through the camera PCB 230, the flexible metal pattern sheet 284, the printed circuit board 150, and the metal portion 140a of the housing 140.

Figure 7:
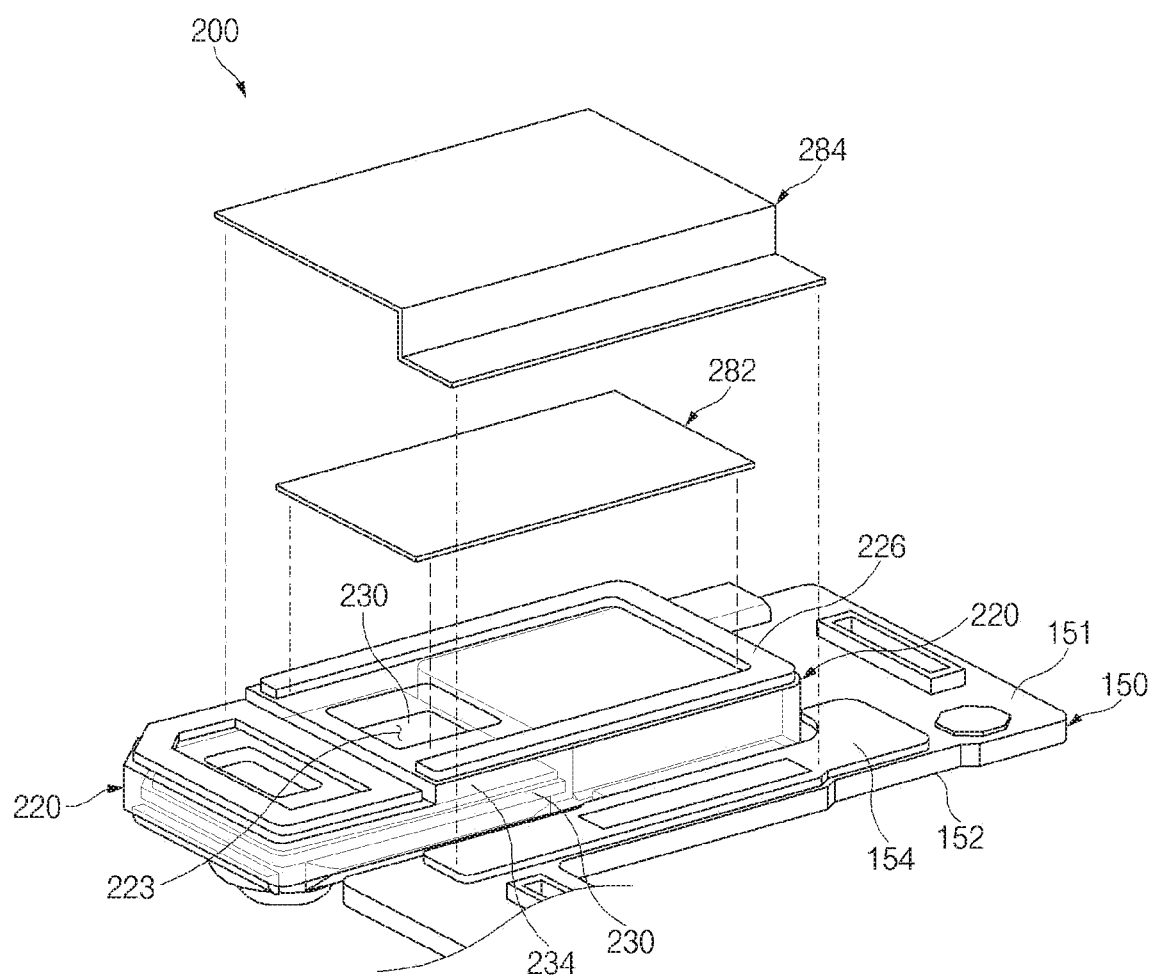
FIG. 7 is a view illustrating a rear side of the electronic device according to an embodiment.

FIG. 7 is a view illustrating a rear side of the electronic device 100 according to an embodiment. FIG. 7 is a view illustrating the electronic device 100 of FIG. 6 from which the housing 140 is omitted.

In various embodiments, the printed circuit board 150 may be spaced apart from the camera module 200 at a certain interval. The second metal layer 154 having a metallic material mounted thereon may be formed on the second surface 152 of the printed circuit board 150. At least a portion of the second metal layer 154 may be covered with the metal pattern sheet 284.

In various embodiments, the metal pattern sheet 284 may include a polymer sheet and a metal pattern formed on the polymer sheet.

In various embodiments, the metal pattern sheet 284 may form a portion of an antenna pattern of the electronic device 100. For example, the antenna pattern may include a metal pattern formed on a polymer sheet, and a portion of the metal pattern may extend to the printed circuit board 150 and may transfer heat to the second metal layer 154.

In various embodiments, the camera bracket 220 may surround the camera PCB 230. The camera bracket 220 may have the opening 223 through which at least a portion of the camera PCB 230 is exposed. The opening 223 may be formed in an area corresponding to a main heat-generating object (e.g., the light emitting unit 240 of FIG. 5) that is mounted on the camera PCB 230. The opening 223 may be covered with the heat dissipating sheet 282. That is, a portion of the heat dissipating sheet 282 and a portion of the camera PCB 230 may face each other through the opening 223. In various embodiments, the heat dissipating sheet 282 may include a graphite sheet.

In various embodiments, the first metal layer 234 may be additionally formed on the rear surface of the camera PCB 230. The first metal layer 234 may be surrounded by the camera bracket 220. At least a portion of the first metal layer 234 may face the heat dissipating sheet 282 though the opening 223. In some embodiments, the camera PCB 230 may be formed of an FPCB. The first metal layer 234 may be formed to reinforce the strength of the camera PCB 230. Heat generated from the camera PCB 230 may be transferred to the first metal layer 234, and the transferred heat may be transferred to the heat dissipating sheet 282 through the opening 223.

In various embodiments, the cushion member 226 may be disposed on the camera bracket 220. The cushion member 226 may include a sponge. The cushion member 226 may surround at least a portion of the heat dissipating sheet 282.

In various embodiments, the heat dissipating sheet 282 may be disposed to cover the opening 223. The cushion member 226 may be disposed around the heat dissipating sheet 282. At least a portion of the heat dissipating sheet 282 may face the first metal layer 234 or the camera PCB 230 through the opening 223. In various embodiments, the heat conductive tape 288 may be additionally formed between the heat dissipating sheet 282 and the metal pattern sheet 284. The heat conductive tape 288 may facilitate heat transfer between the heat dissipating sheet 282 and the metal pattern sheet 284.

In various embodiments, at least a portion of the metal pattern sheet 284 may cover the heat dissipating sheet 282 and the cushion member 226. The metal pattern sheet 284 may extend from the camera module 200 (e.g., the camera bracket 220) to the printed circuit board 150. The metal pattern sheet 284 may extend to the second metal layer 154 of the printed circuit board 150. At least a portion of the metal pattern sheet 284 may cover the second metal layer 154.

In various embodiments, the heat conductive tape 288 for increasing an adhesive force may be additionally formed between the second metal layer 154 and the metal pattern sheet 284. The heat conductive tape 288 may facilitate heat transfer between the second metal layer 154 and the metal pattern sheet 284.

Figure 8:
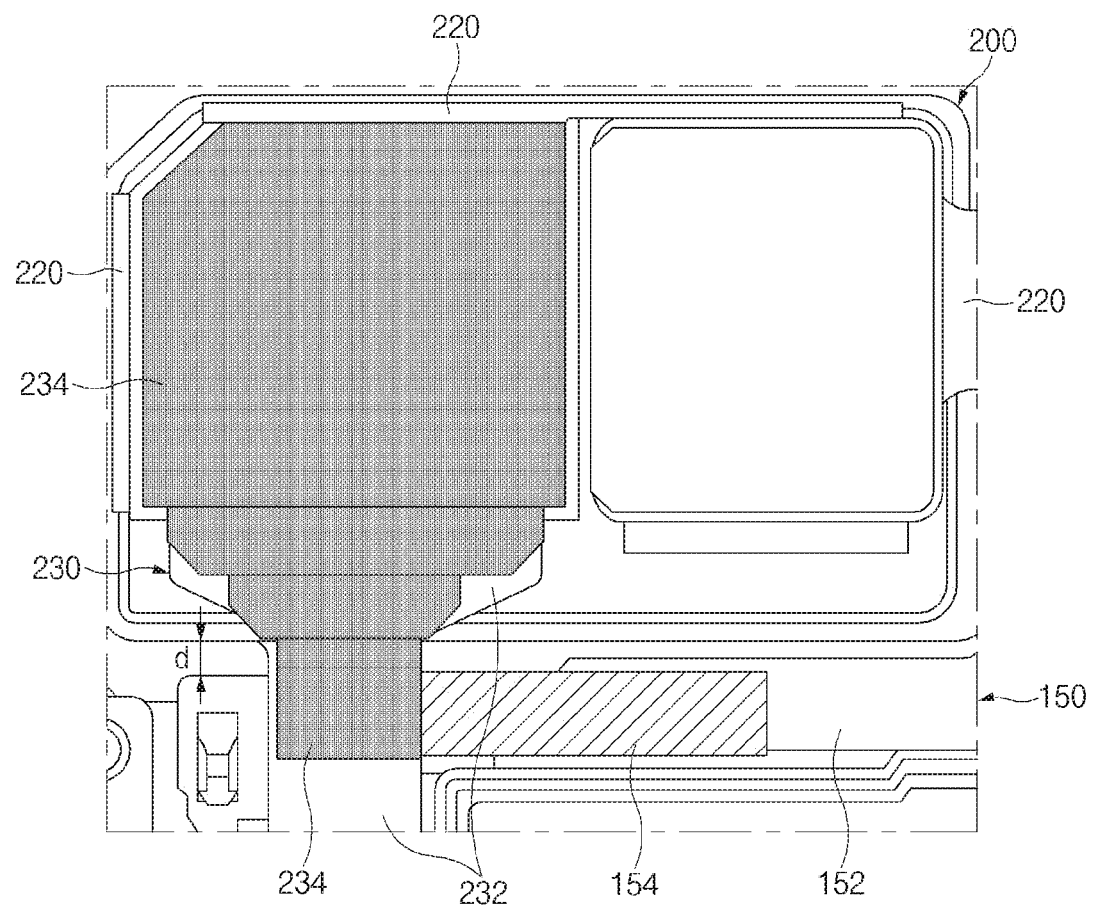
FIG. 8 is a view illustrating the camera module of the electronic device according to various embodiments.
Figure 9A:
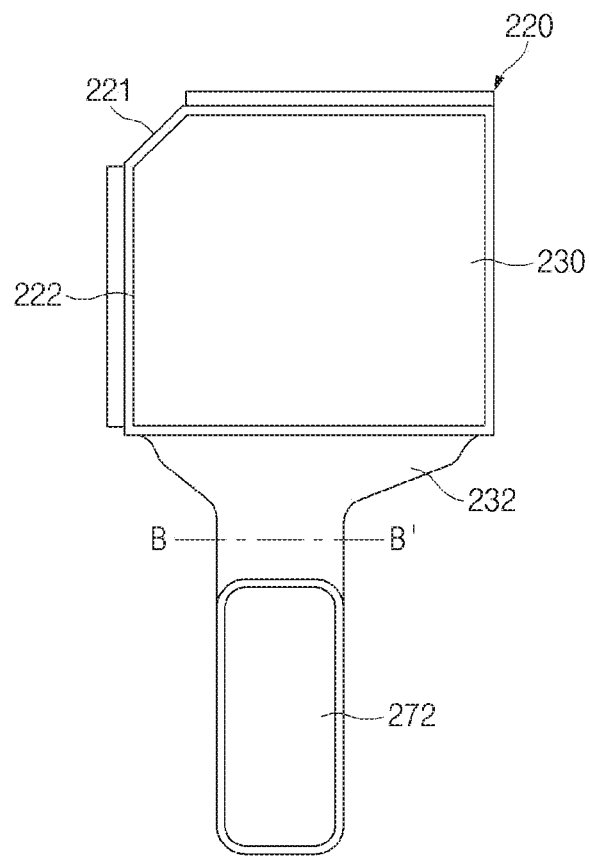
FIGS. 9A and 9B are views illustrating a camera PCB of the electronic device according to various embodiments.
Figure 9B:
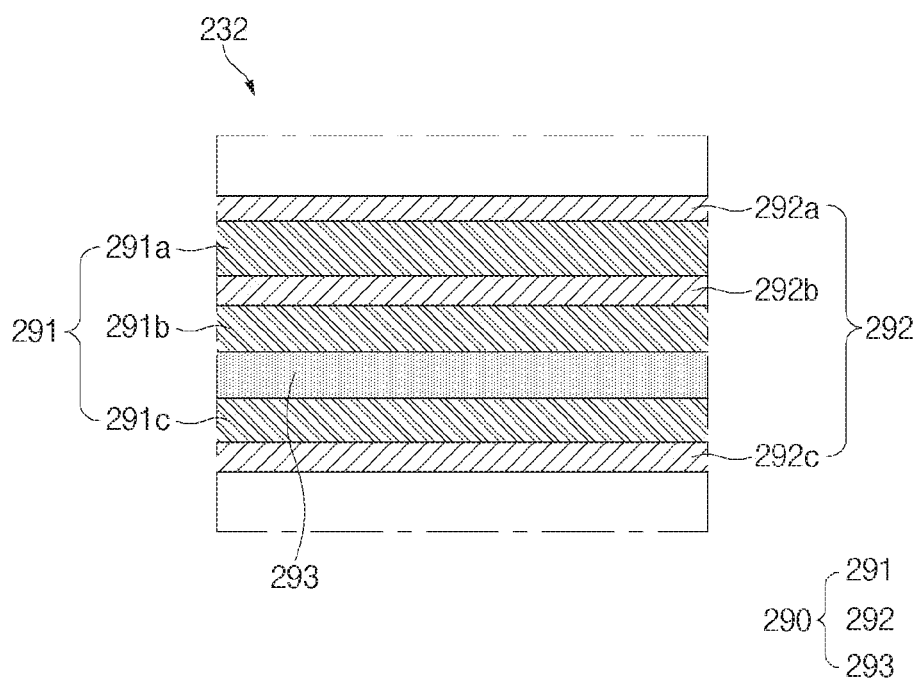

FIG. 8 is a view illustrating the camera module 200 of the electronic device 100 according to various embodiments. FIGS. 9A and 9B are views illustrating the camera PCB 230 of the electronic device 100 according to various embodiments. FIGS. 8, 9A, and 9B are views illustrating the camera module 200 when viewed from the rear side of the electronic device 100.

Referring to FIGS. 8, 9A, and 9B, the camera PCB 230 may include an extension 232 extending outside the camera bracket 220 (or the camera housing 210) and a connector 272 formed on the extension 232. The extension 232 may extend from the inside of the camera bracket 220 to the printed circuit board 150. The extension 232 of the camera PCB 230 may extend across the second metal layer 154 formed on the printed circuit board 150. The camera PCB 230 and the extension 232 of the camera PCB 230 may be formed of one FPCB. The FPCB may include an interconnection layer 291 for electrically connecting electric elements (e.g., the light emitting unit 240, the light receiving unit 250, and the control circuitry 260) mounted on the camera PCB 230 with one or more electric elements (e.g., a processor) mounted on the printed circuit board 150, or a ground area.

Referring to FIG. 8, the first metal layer 234 for reinforcing strength may be formed on the camera PCB 230. The first metal layer 234 may extend from the inside of the camera bracket 220 to the outside thereof. The first metal layer 234 may extend outside the camera bracket 220 to correspond to the extension 232.

In the illustrated embodiment, the connector 272 may be formed on the extension 232 of the camera PCB 230. The connector 272 may be coupled to a corresponding connector formed on the printed circuit board 150.

FIG. 9B is a sectional view of the camera PCB taken along line B-B' of FIG. 9A.

In various embodiments, the camera PCB 230 may include a plurality of layers 290. The extension 232 may include a plurality of insulation layers 292a, 292b, and 292c and a plurality of interconnection layers 291 including interconnections for signal transmission. The plurality of interconnection layers 291 may include signal layers 291a and 291b that include interconnections for signal transmission and a ground layer 291c that includes a ground area. The interconnections included in the signal layers 291a and 291b may be electrically connected with interconnections of the printed circuit board 150 by a coupling of the connector 272 and the corresponding connector. The ground area included in the ground layer 291c may be electrically connected with a ground area of the printed circuit board 150 by a coupling of the connector 272 and the corresponding connector. In various embodiments, at least one of the interconnection layers 291 may include a first interconnection for signal transmission and a second interconnection for ground signal transmission.

In the illustrated embodiment, the insulation layers 292a, 292b, and 292c may be formed of an insulating material. Some 292a and 292c of the insulation layers 292a, 292b, and 292c may form a surface of the extension 232. The interconnection layers 291a, 291b, and 291c may be disposed between the insulation layers 292a, 292b, and 292c. The plurality of interconnection layers 291a, 291b, and 291c may include one or more signal layers and one or more ground layers. The one or more signal layers may include a plurality of interconnections for transmission of a plurality of electrical signals.

In various embodiments, the plurality of layers 290 may include a flexible layer 293 containing a flexible material. The interconnection layers 291 may be disposed on opposite surfaces of the flexible layer 293. The flexible layer 293 may provide flexibility to the camera PCB 230 and/or the extension 232.

In various embodiments, at least some of the interconnection layers 291a, 291b, and 291c may contain a conductive material. For example, the conductive material may include copper.

In various embodiments, a part of the interconnection layers 291a, 291b, and 291c may be formed to be a heat transfer layer (e.g., 291a) for transferring heat generated from the camera PCB 230 to the printed circuit board 150. The heat transfer layer (e.g., 291a) may contain a heat conductive material having high thermal conductivity. For example, the heat conductive material may include a silver paste.

In some embodiments, some of the interconnection layers 291a, 291b, and 291c may contain a heat conductive material and a conductive material. The conductive material may form an interconnection for signal transmission or a ground area. The heat conductive material may form a heat transfer path. That is, one interconnection layer may include at least one of an interconnection for signal transmission, a ground area, and a heat transfer path.

The camera PCB 230 and/or the extension 232 disclosed herein is not limited to the layers illustrated in the drawing and is not limited to the illustrated stack structure. That is, signal layers (e.g., 291a and 291b), a ground layer (e.g., 291c), a heat conduction layer (e.g., 291a), and the flexible layer 293 may be stacked in various sequences.

In various embodiments, the heat transfer layer may be connected to the second metal layer 154 of the printed circuit board 150 through a coupling of the connector 272 and the corresponding connector.

In some embodiments, the heat transfer layer (e.g., 291a) may be formed directly under the insulation layers 292a and 292c that form the surface of the extension 232. At this time, a portion of each of the insulation layers 292a and 292c may be removed such that a portion of the heat transfer layer (e.g., 291a) makes contact with a second metal layer (e.g., the second metal layer 154 of FIG. 6) of a printed circuit board (e.g., the printed circuit board 150 of FIG. 6). In addition, the heat transfer layer (e.g., 291a) may make contact with the second metal layer 154 of the printed circuit board 150 in various structures.

Figure 10A:
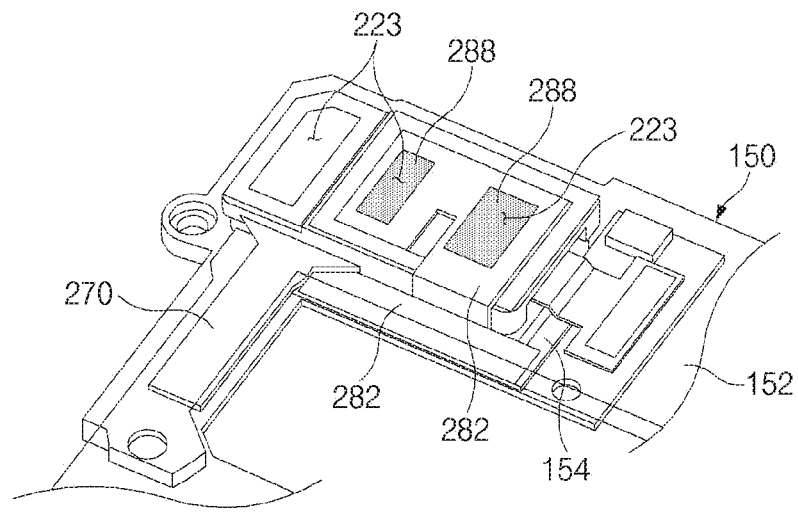
FIGS. 10A to 10C are views illustrating the camera module of the electronic device according to various embodiments.
Figure 10B:
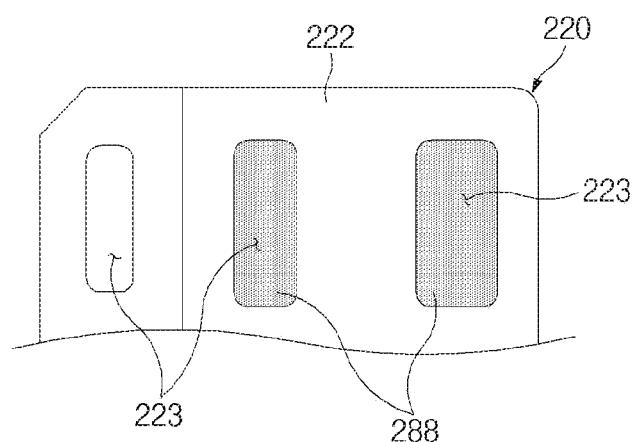
Figure 10C:
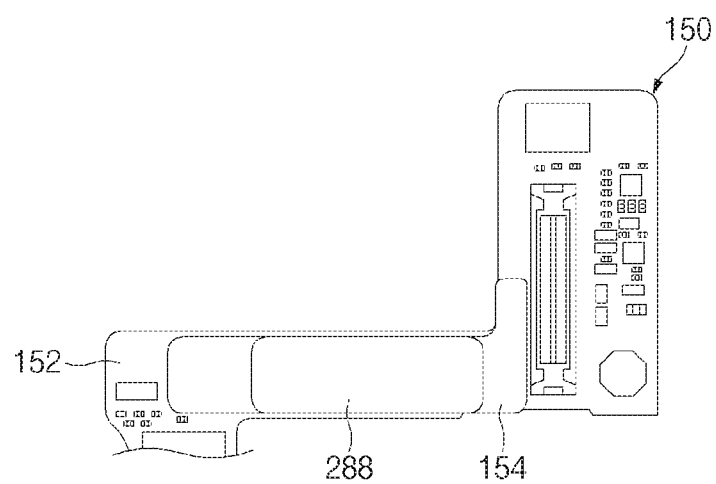

FIGS. 10A to 10C are views illustrating the camera module 200 of the electronic device 100 according to various embodiments. FIG. 10A is a perspective view illustrating the camera module 200 and the printed circuit board 150. FIG. 10B is a view illustrating a rear surface of the camera bracket 220 illustrated in FIG. 10A. FIG. 10C is a view illustrating a portion of the printed circuit board 150 illustrated in FIG. 10A.

In the illustrated embodiment, the camera bracket 220 may include one or more openings 223. As described above, a camera PCB (e.g., the camera PCB 230 of FIG. 10) or a first metal layer (e.g., the first metal layer 234 of FIG. 6) that is formed on the camera PCB 230 may be exposed through the openings 223. The heat conductive tape 288 may be formed on the camera bracket 220 to cover the openings 223. The heat conductive tape 288 may cover at least one of the openings 223.

In the illustrated embodiment, the heat dissipating sheet 282 may be formed on the camera bracket 220 to cover at least some of the openings 223. The heat dissipating sheet 282 may extend from the camera bracket 220 to the printed circuit board 150. The heat dissipating sheet 282 may be attached to the camera bracket 220 by the heat conductive tape 288 formed to cover the openings 223 of the camera bracket 220. A portion of the heat dissipating sheet 282 may be attached to the second metal layer 154 formed on the printed circuit board 150. In various embodiments, the heat dissipating sheet 282 may include a graphite sheet.

In the illustrated embodiment, the heat conductive tape 288 may be formed on the second metal layer 154. A portion of the heat dissipating sheet 282 that extends to the second metal layer 154 may be attached to the second metal layer 154 by the heat conductive tape 288. Accordingly, heat generated from the camera module 200 may be transferred to the heat dissipating sheet 282 through the heat conductive tape 288, and the heat transferred to the printed circuit board 150 along the heat dissipating sheet 282 may be transferred to the second metal layer 154 by the heat conductive tape 288.

Figure 11A:
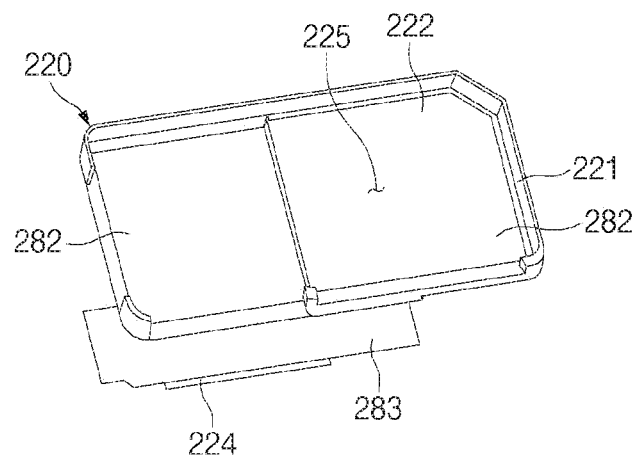
FIGS. 11A to 11C are views illustrating the camera module of the electronic device according to various embodiments.
Figure 11B:
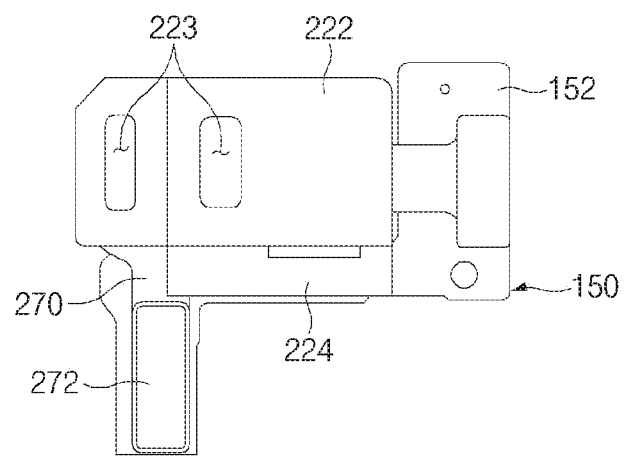
Figure 11C:
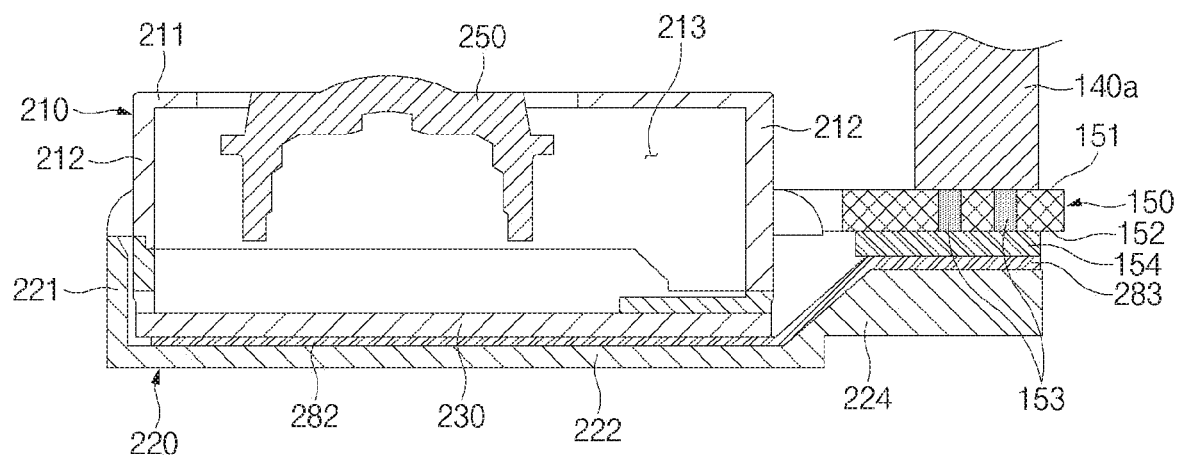

FIGS. 11A to 11C are views illustrating the camera module 200 of the electronic device 100 according to various embodiments. FIG. 11A is a view illustrating the camera bracket 220. FIG. 11B is a view illustrating a rear surface of the camera bracket 220 illustrated in FIG. 11A. FIG. 11C is a sectional view illustrating a state in which the camera PCB 230 and the camera housing 210 are mounted on the camera bracket 220 illustrated in FIG. 11A.

In various embodiments, the camera bracket 220 may include a bottom surface 222 and a sidewall 221 surrounding a portion of the bottom surface 222. The bottom surface 222 and the sidewall 221 may form a portion of a space 225 in which the camera housing 210 is disposed. The bottom surface 222 of the camera bracket 220 may include an extension 224 that extends outside the camera housing 210. The extension 224 may extend to the printed circuit board 150.

In various embodiments, the camera bracket 220 and the camera housing 210 may form a space 213 in which the camera PCB 230 of the camera module 200 is disposed. The light receiving unit 250, a light emitting unit (e.g., the light emitting unit 240 of FIG. 6), and control circuitry (e.g., the control circuitry 260 of FIG. 6) may be disposed on the camera PCB 230. At least a portion of the light receiving unit 250 may be exposed through a first surface 211 of the camera housing 210. The camera housing 210 may include the first surface 211 and a side surface 212 extending from the first surface 211 to the camera bracket 220 (e.g., the sidewall 221).

In various embodiments, the heat dissipating sheet 282 may be disposed on the bottom surface 222 of the camera bracket 220. The heat dissipating sheet 282 may be formed in the space 225 in which the camera housing 210 is disposed. The heat dissipating sheet 282 may extend to the printed circuit board 150 along the extension 224 of the bottom surface 222 of the camera bracket 220. The heat dissipating sheet 282 may include an extending area 283 that extends outside the sidewall 221. The extending area 283 of the heat dissipating sheet 282 may be formed to be wider than the extension 224 of the bottom surface 222. The heat dissipating sheet 282 may extend outside the sidewall 221 such that the extending area 283 makes contact with the second metal layer 154 formed on the second surface 152 of the printed circuit board 150. The second metal layer 154 may contain stainless steel or clad metal.

In various embodiments, the printed circuit board 150 may be formed such that the metal portion 140*a* of the housing 140 is brought into contact with at least a portion of the first surface 151. The metal portion 140*a* of the housing 140 may be brought into contact with an area corresponding to the area where the second metal layer 154 is formed. The printed circuit board 150 may include the plurality of vias 153 that pass through the first surface 151 and the second surface 152. Each of the vias 153 may include one end portion making contact with the second metal layer 154 and an opposite end portion making contact with the metal portion 140*a* of the housing 140. Accordingly, heat generated in the camera housing 210 may be transferred to the heat dissipating sheet 282 formed inward of the sidewall 221 of the camera bracket 220, and the heat may be transferred to the second metal layer 154 along the extension 224 of the heat dissipating sheet 282. The heat transferred to the second metal layer 154 may be transferred to the metal portion 140*a* of the housing 140 through the plurality of vias 153. In various embodiments, the heat conductive tape 288 may be additionally formed between the heat dissipating sheet 282 and the second metal layer 154.

FIGS. 12A to 12D are views illustrating the camera module 200 of the electronic device 100 according to various embodiments.

Figure 12A:
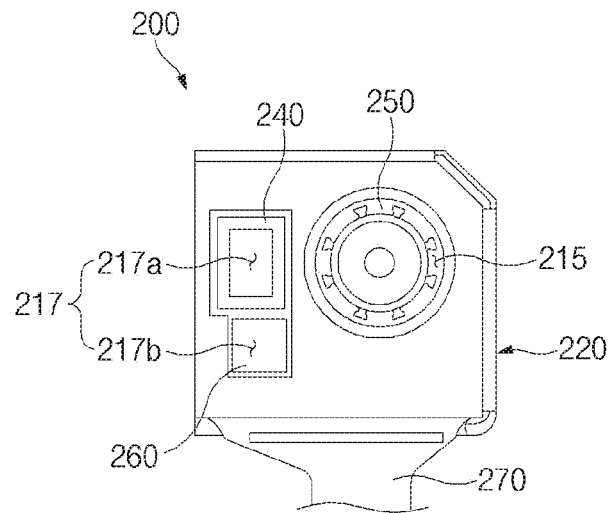
FIGS. 12A to 12D are views illustrating the camera module of the electronic device according to various embodiments.
Figure 12B:
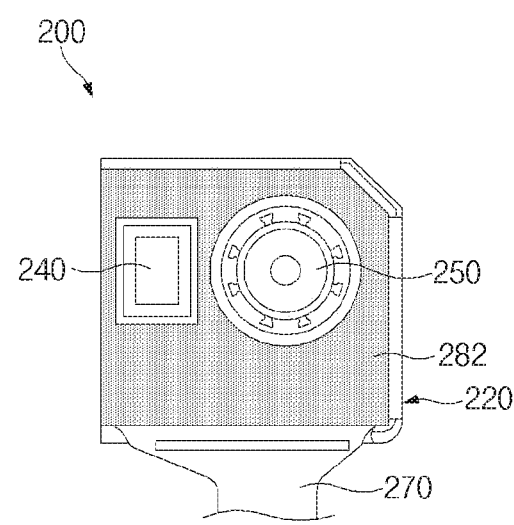
Figure 12C:
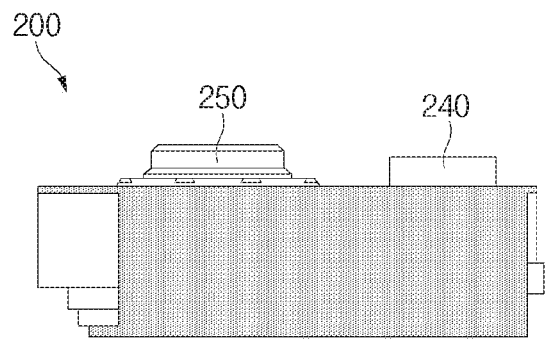
Figure 12D:
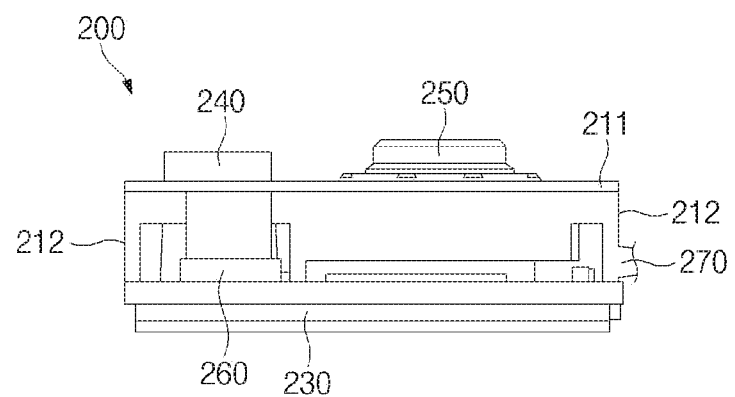

Referring to FIGS. 12A and 12D, the camera PCB 230, on which the light receiving unit 250, the light emitting unit 240, and the control circuitry 260 are disposed, may be disposed in the camera housing 210. The camera housing 210 may have, in the first surface 211 thereof, the first opening 215 through which the light receiving unit 250 is exposed and the second opening 217 through which the light emitting unit 240 is exposed. The light receiving unit 250 may further protrude beyond the first surface 211 of the camera housing 210 through the first opening 215. The light emitting unit 240 may further protrude beyond the first surface 211 of the camera housing 210 through the second opening 217. The second opening 217 may include a first portion 217*a* through which the light emitting unit 240 is exposed and a second portion 217*b* through which the control circuitry 260 adjacent to the light emitting unit 240 is exposed. In some embodiments, the first portion 217*a* and the second portion 217*b* may be formed to be separate openings.

Referring to FIGS. 12B and 12C, the camera module 200 may further include the heat dissipating sheet 282 surrounding the camera housing 210. The heat dissipating sheet 282 may be formed to cover at least the first surface 211 of the camera housing 210. The heat dissipating sheet 282 may be formed to cover the second portion 217*b* through which the control circuitry 260 is exposed and so as not to cover the first portion 217*a* through which the light emitting unit 240 is exposed. Accordingly, light emitted from the light emitting unit 240 may not be blocked by the heat dissipating sheet 282. Furthermore, heat generated in the camera housing 210 may be transferred to the heat dissipating sheet 282 through the second portion 217*b* of the second opening 217. In the illustrated embodiment, the heat dissipating sheet 282 may surround at least a portion of the side surface 212 of the camera housing 210.

In various embodiments, at least a portion of the heat dissipating sheet 282 may extend to the metal portion 140*a* of the housing 140 such that heat generated in the camera housing 210 is transferred to the metal portion 140*a* of the housing 140.

An electronic device 100 according to an embodiment of the disclosure may include a housing 140 including a frame structure 141 that forms a portion of a surface of the electronic device 100 and a plate structure 142 that is surrounded by the frame structure 141 and that includes a first opening, the housing 140 including a metal portion 140*a* containing a metallic material and a polymer portion containing a polymer material, a support plate 160 that faces the plate structure 142 and that includes a polymer area formed of a polymer material, a printed circuit board 150 that is disposed between the plate structure 142 and the support plate 160 and that makes contact with part of the metal portion 140*a* of the housing 140, a camera module 200 disposed between the polymer portion included in the plate structure 142 and the polymer area included in the support plate 160, the camera module 200 including a camera bracket 220 disposed on the polymer area, a camera PCB 230 disposed on the camera bracket 220, and a light emitting unit 240 and a light receiving unit 250 that are disposed on the camera PCB 230, and a heat dissipating structure that transfers heat generated from the camera module 200 to the metal portion 140*a* included in the housing 140. The heat dissipating structure may include a heat transfer member 284 that is formed between the camera bracket 220 and the polymer area and that extends between the printed circuit board 150 and the support plate 160.

In various embodiments, the first opening may be formed on a periphery of the plate structure 142, and a peripheral portion and an inner wall of the first opening may be formed by the polymer portion.

In various embodiments, the electronic device 100 may further include a display module 130 that forms a surface of the electronic device 100. The frame structure 141 of the housing 140 may include a seating area 143 that is included in the polymer portion and that extends toward the interior of the housing 140 and has at least a portion that covers a portion of the first opening. The display module 130 may be seated on the seating area 143, and the seating area 143 may include a second opening with which the light emitting unit 240 and the light receiving unit 250 are aligned.

In various embodiments, the display module 130 may include a first cover 120 that forms the surface of the electronic device 100, a plurality of layers that are stacked on the first cover 120 and that face toward the plate structure 142, and a hole formed through the plurality of layers, the hole may be formed to be at least partially aligned with the first opening 215 or second opening 217, and the light emitting unit 240 and the light receiving unit 250 of the camera module 200 may be exposed on the surface of the electronic device 100 through the first cover 120 and may be configured to transmit and receive light through the hole and the first cover 120.

In various embodiments, the polymer portion may include an antenna pattern formed in a position adjacent to the camera module 200.

In various embodiments, the printed circuit board 150 may include a first surface 151 that faces toward the plate structure 142 and a second surface 152 opposite to the first surface 151. The first surface 151 may include a first contact area that makes contact with the metal portion 140*a* included in the plate structure 142, and the second surface may include a second contact area on which the heat transfer member is disposed. The printed circuit board 150 may include a plurality of first vias 153 that pass through the first contact area and the second contact area, and the heat transfer member 284 may be connected with the first vias 153.

In various embodiments, the heat dissipating structure may further include a heat conductive tape 288 disposed between the heat transfer member 284 and the second contact area and a first metal layer 234 formed between the heat conductive tape 288 and the second contact area.

In various embodiments, the heat dissipating structure may further include a graphite sheet 282 disposed between the heat transfer member 284 and the camera bracket 220.

In various embodiments, the heat transfer member 284 of the heat dissipating structure may be attached to the support plate 160 by a heat conductive tape 288.

In various embodiments, the camera bracket 220 may support the camera PCB 230 such that the camera PCB 230 is spaced apart from the heat transfer member at a certain interval.

In various embodiments, the camera bracket 220 may further include a cushion member 226 seated on at least a portion of the heat transfer member 284.

In various embodiments, the electronic device 100 may further include a display module 130 including a first cover 120 that forms a surface of the electronic device 100 and a plurality of layer structures stacked in a direction toward the plate structure 142 from the first cover 120 and a second camera module 202 that is formed adjacent to the camera module 200 and that includes a second camera device. The display module 130 may further include a through-hole formed through the plurality of layer structures, and the second camera device may be aligned with the through-hole.

In various embodiments, the camera bracket 220 may include a third opening 223 formed such that the camera PCB 230 is viewed in a direction toward the support plate 160, and the heat transfer member 284 may be formed to cover the third opening 223.

In various embodiments, the camera PCB 230 may include a mounting area on which the light emitting unit 240 and the light receiving unit 250 are disposed and a peripheral area around the mounting area, the camera bracket 220 may support the peripheral area of the camera PCB 230, and the camera PCB 230 may include a plurality of vias formed in the mounting area.

In various embodiments, the camera PCB 230 may further include an extension 232 extending between the printed circuit board 150 and the metal portion 140*a* of the housing 140 and a connector 272 formed on the extension 232 and coupled to a corresponding connector formed on the printed circuit board 150, and the extension 232 may include a heat transfer layer (at least one of 291*a*, 291*b*, and 291*c*) that contains a thermal adhesive material.

In various embodiments, the camera PCB 230 may be formed of a flexible PCB.

In various embodiments, the extension 232 may extend to the second surface 152 of the printed circuit board 150, and the extension 232 may further include a third metal layer (at least one of 291*a*, 291*b*, and 291*c*) that makes contact with the metal portion 140*a* of the housing 140.

In various embodiments, the printed circuit board 150 may further include a ground layer (at least one of 291*a*, 291*b*, and 291*c*) in which a ground area is formed and a ground via extending from the ground layer to the second surface of the printed circuit board 150, the extension 232 may further include a graphite sheet attached to the third metal layer (at least one of 291*a*, 291*b*, and 291*c*) by a heat conductive tape 288, and the graphite sheet may be connected to the ground via.

In various embodiments, the electronic device 100 may further include a display module 130 that covers the plate structure 142, and the plate structure 142 may include a first surface that faces the display module 130 and a second surface on which the printed circuit board 150 is disposed.

In various embodiments, the heat dissipating structure may include a first metal layer 234 formed on the camera PCB 230 and a second metal layer 154 formed on the printed circuit board 150, the heat transfer member may extend from the first metal layer 234 to the second metal layer 154, and each of the first metal layer 234 and the second metal layer 154 may contain clad metal.

According to the embodiments of the disclosure, heat generated from the TOF camera may be rapidly diffused across the surface of the electronic device, and thus heat generation on the surface of a specific portion of the electronic device may be reduced. Furthermore, the TOF camera may be stably driven for a long time by heat generation control.

In addition, the disclosure may provide various effects that are directly or indirectly recognized.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program) including one or more instructions that are stored in a storage medium (e.g., internal memory or external memory) that is readable by a machine (e.g., the electronic device). For example, a processor (e.g., the processor) of the machine (e.g., the electronic device) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

While the disclosure has been shown and described with reference to various embodiments thereof, it will be understood by those skilled in the art that various changes in form and details may be made therein without departing from the spirit and scope of the disclosure as defined by the appended claims and their equivalents.

Although the present disclosure has been described with various embodiments, various changes and modifications may be suggested to one skilled in the art. It is intended that the present disclosure encompass such changes and modifications as fall within the scope of the appended claims.

What is claimed is:

1. An electronic device comprising:
   a housing including:
   a frame structure configured to form a portion of a surface of the electronic device,
   a plate structure surrounded by the frame structure, the plate structure including a first opening,
   a metal portion containing a metallic material, and
   a polymer portion containing a polymer material;
   a support plate configured to face the plate structure, the support plate including a polymer area formed of a polymer material;
   a printed circuit board disposed between the plate structure and the support plate, the printed circuit board configured to make contact with part of the metal portion of the housing;
   a camera module disposed between a part of the polymer portion included in the plate structure and the polymer area included in the support plate, wherein the camera module includes a camera bracket disposed on the polymer area, a camera PCB disposed on the camera bracket, a light emitting unit, and a light receiving unit, the light emitting unit and light receiving unit disposed on the camera PCB; and
   a heat dissipating structure configured to transfer heat generated from the camera module to the metal portion included in the housing,
   wherein the heat dissipating structure includes a heat transfer member that is formed between the camera bracket and the polymer area and that extends between the printed circuit board and the support plate.

2. The electronic device of claim 1, wherein:
   the first opening is formed on a periphery of the plate structure, and
   a peripheral portion and an inner wall of the first opening are formed by the polymer portion.

3. The electronic device of claim 1, further comprising a display module configured to form a surface of the electronic device,
   wherein the frame structure of the housing includes a seating area that is included in the polymer portion and that extends toward an interior of the housing and has at least a portion configured to cover a portion of the first opening,
   wherein the display module is seated on the seating area, and
   wherein the seating area includes a second opening with which the light emitting unit and the light receiving unit are aligned.

4. The electronic device of claim 3, wherein:
   the display module includes a first cover configured to form the surface of the electronic device, a plurality of layers stacked on the first cover and configured to face toward the plate structure, and a hole formed through the plurality of layers, the hole is formed to be at least partially aligned with the second opening, and the light emitting unit and the light receiving unit of the camera module are exposed on the surface of the electronic device through the first cover and are configured to transmit and receive light through the hole and the first cover.

5. The electronic device of claim 1, wherein the polymer portion includes an antenna pattern formed in a position adjacent to the camera module.

6. The electronic device of claim 1, wherein:

the printed circuit board includes a first surface configured to face toward the plate structure and a second surface opposite to the first surface, the first surface includes a first contact area configured to make contact with the metal portion included in the plate structure, the second surface includes a second contact area on which the heat transfer member is disposed, the printed circuit board includes a plurality of first vias configured to pass through the first contact area and the second contact area, and the heat transfer member is connected with the first vias.

7. The electronic device of claim 6, wherein the heat dissipating structure further includes:

a heat conductive tape disposed between the heat transfer member and the second contact area; and a first metal layer formed between the heat conductive tape and the second contact area.

8. The electronic device of claim 6, wherein the heat dissipating structure further includes a graphite sheet disposed between the heat transfer member and the camera bracket.

9. The electronic device of claim 1, wherein the heat transfer member of the heat dissipating structure is attached to the support plate by a heat conductive tape.

10. The electronic device of claim 1, wherein the camera bracket supports the camera PCB such that the camera PCB is spaced apart from the heat transfer member at a certain interval.

11. The electronic device of claim 1, wherein the camera bracket further includes a cushion member seated on at least a portion of the heat transfer member.

12. The electronic device of claim 1, further comprising:

a display module including a first cover configured to form a surface of the electronic device and a plurality of layer structures stacked in a direction toward the plate structure from the first cover; and a second camera module formed adjacent to the camera module, the second camera module including a camera device, wherein the display module further includes a through-hole formed through the plurality of layer structures, and wherein the camera device is aligned with the through-hole.

13. The electronic device of claim 1, wherein the camera bracket includes a third opening formed such that the camera PCB is viewed in a direction toward the support plate, and wherein the heat transfer member is formed to cover the third opening.

14. The electronic device of claim 1, wherein:

the camera PCB includes a mounting area on which the light emitting unit and the light receiving unit are disposed and a peripheral area around the mounting area, the camera bracket supports the peripheral area of the camera PCB, and the camera PCB includes a plurality of vias formed in the mounting area.

15. The electronic device of claim 1, wherein:

the camera PCB further includes an extension extending between the printed circuit board and the metal portion of the housing and a connector formed on the extension and coupled to a corresponding connector formed on the printed circuit board, and the extension includes a heat transfer layer containing a thermal adhesive material.

16. The electronic device of claim 15, wherein the camera PCB is formed of a flexible PCB.

17. The electronic device of claim 15, wherein:

the printed circuit board includes a first surface configured to face toward the plate structure and a second surface opposite to the first surface, the extension extends to the second surface of the printed circuit board, and the extension further includes a metal layer configured to make contact with the metal portion of the housing.

18. The electronic device of claim 17, wherein:

the printed circuit board further includes a ground layer in which a ground area is formed and a ground via extending from the ground layer to the second surface of the printed circuit board, the extension further includes a graphite sheet attached to the metal layer by a heat conductive tape, and the graphite sheet is connected to the ground via.

19. The electronic device of claim 1, further comprising a display module configured to cover the plate structure, wherein the plate structure includes a first surface configured to face the display module and a second surface on which the printed circuit board is disposed.

20. The electronic device of claim 1, wherein:

the heat dissipating structure includes a first metal layer formed on the camera PCB and a second metal layer formed on the printed circuit board, the heat transfer member extends from the first metal layer to the second metal layer, and each of the first metal layer and the second metal layer contains clad metal.

\* \* \* \* \*